(12) United States Patent
Goldmann et al.

(10) Patent No.: US 10,443,294 B2
(45) Date of Patent: Oct. 15, 2019

(54) CONTROL METHOD AND CONTROL SYSTEM FOR A VEHICLE CLOSING ELEMENT

(71) Applicant: Brose Fahrzeugteile GmbH & Co. Kommanditgesellschaft, Bamberg, Bamberg (DE)

(72) Inventors: Thomas Goldmann, Bayreuth (DE); Andre Gunreben, Hallstadt (DE)

(73) Assignee: Brose Fahrzeugteile GMBH & Co. Kommanditgesellschaft, Bamberg, Bamberg (DE)

( * ) Notice: Subject to any disclaimer, the term of this patent is extended or adjusted under 35 U.S.C. 154(b) by 0 days.

(21) Appl. No.: 15/922,254

(22) Filed: Mar. 15, 2018

(65) Prior Publication Data

US 2018/0313133 A1 Nov. 1, 2018

(30) Foreign Application Priority Data

Apr. 28, 2017 (DE) .................. 10 2017 207 279

(51) Int. Cl.
*E05F 15/73* (2015.01)
*B60R 25/20* (2013.01)
(Continued)

(52) U.S. Cl.
CPC .......... *E05F 15/73* (2015.01); *B60R 25/2054* (2013.01); *B60R 25/246* (2013.01);
(Continued)

(58) Field of Classification Search
None
See application file for complete search history.

(56) References Cited

U.S. PATENT DOCUMENTS 8,788,152 B2 * 7/2014 Reimann ............. B60R 25/2036
296/146.4
9,162,685 B2 * 10/2015 Schindler .............. B60W 50/08
(Continued)

FOREIGN PATENT DOCUMENTS

DE  102010060364 A1   5/2012
DE  102014101201 A1   8/2015
(Continued)

OTHER PUBLICATIONS

European Search Report dated Sep. 14, 2018 issued in corresponding Application No. 18167030.8-1132, 5 pages.

*Primary Examiner* — K. Wong
(74) *Attorney, Agent, or Firm* — Lewis Roca Rothgerber Christie LLP (57) ABSTRACT

It is provided a method for controlling an adjusting movement of a power-operated adjustable vehicle closing element, such as e.g. a side door or a liftgate, which can automatically be adjusted in the presence of an operating event. By means of a sensor device an operating event is detected in a contactless way. For the detection of an operating event a course of measurement values detected by the sensor device in a detection time interval is evaluated. Furthermore, at least one trigger signal, in particular a trigger signal of defined signal length and/or a trigger signal that triggers an execution of an authentication process preceding the adjustment of the vehicle closing element, in which the presence of a valid identification means in a vicinity of the vehicle is checked, is generated and sent.

16 Claims, 5 Drawing Sheets

Stand der Technik (51) Int. Cl.
*B60R 25/24* (2013.01)
*H03K 17/955* (2006.01)
*E05F 15/76* (2015.01)
*G07C 9/00* (2006.01)

(52) U.S. Cl.
CPC ........... *E05F 15/76* (2015.01); *H03K 17/955* (2013.01); *E05Y 2400/85* (2013.01); *E05Y 2400/858* (2013.01); *E05Y 2900/50* (2013.01); *E05Y 2900/532* (2013.01); *E05Y 2900/546* (2013.01); *G07C 9/00309* (2013.01); *G07C 2009/00388* (2013.01); *G07C 2209/65* (2013.01)

(56) References Cited

U.S. PATENT DOCUMENTS

| | | | |
|---|---|---|---|
| 9,593,522 | B1 * | 3/2017 | Murar .................... E05F 15/77 |
| 2012/0319502 | A1 | 12/2012 | Van Gastel |
| 2015/0325066 | A1 | 11/2015 | Müller |
| 2016/0137165 | A1 | 5/2016 | Schindler et al. |
| 2017/0166167 | A1 | 6/2017 | Heller et al. |
| 2017/0174179 | A1 | 6/2017 | Schumacher et al. |

FOREIGN PATENT DOCUMENTS

| | | |
|---|---|---|
| DE | 10-2015-009-749 A1 | 2/2016 |
| JP | 2016-35194 | 3/2016 |
| WO | WO 2011/092341 A1 | 8/2011 |
| WO | WO 2012/059100 A2 | 5/2012 |
| WO | WO 2014/032988 A1 | 3/2014 |
| WO | WO 2015/000608 A1 | 1/2015 |
| WO | WO 2015/113554 A1 | 8/2015 |

\* cited by examiner

FIG 5
Stand der Technik

CONTROL METHOD AND CONTROL SYSTEM FOR A VEHICLE CLOSING ELEMENT

REFERENCE TO RELATED APPLICATION

This application claims priority to and the benefit of German Patent Application No. 10 2017 207 279.2 filed on Apr. 28, 2017, the entirety of which is incorporated by reference herein.

BACKGROUND

The present invention relates to a method for controlling an adjusting movement of a power-operated adjustable vehicle closing element, such as a vehicle side door or a vehicle liftgate, and to a control system.

For triggering an adjusting movement of a power-operated, in particular motor-driven adjustable vehicle closing element, it is known to detect operating events in a contactless manner by means of at least one sensor element of a sensor device provided at the vehicle, which originate from a movement of an (authorized) user. For this purpose, a sensor element comprises for example a proximity sensor by which a kick movement of a person can be detected and this can possibly be assessed as an operating event in order to initiate a motor-driven adjustment of the vehicle closing element.

For the detection of an operating event in the form of a kick movement, which for example is carried out in the region of a bumper of the vehicle, a course of measurement values detected (continuously or discretely) by the sensor device in a detection time interval is evaluated. When it can then be detected by means of an evaluation logic of an electronic control device with reference to a sequence of a plurality of measurement values by comparison with stored reference and/or threshold values that the person has carried out the movement to be assessed as an operating event in the detection area, the adjustment of the vehicle closing element is effected.

The actual adjustment of the vehicle closing element usually is preceded by the generation and the sending of at least one trigger signal that triggers at least one operation preceding the adjustment of the vehicle closing element. Via a trigger signal for example after the detection of an operating event the execution of an authentication process can be triggered, in which the presence of a valid identification means in the vicinity of the vehicle is checked. Only when both an operating event has been detected and a valid identification means is present in the vicinity of the vehicle and hence both conditions are cumulatively fulfilled is an adjustment of the vehicle closing element triggered. For adjusting the vehicle closing element a (further) trigger signal then is sent to a drive in order to activate the same. By means of this further trigger signal or by means of a preceding trigger signal a lock that locks the vehicle closing element in a closed position can also be actuated.

In control methods implemented in practice so far, the respective necessary trigger signals for the operations preceding the actual adjustment of the vehicle closing element, without the execution of which an adjustment of the vehicle closing element does not occur, are generated and sent one after the other and only after the evaluation as to whether an operating event is present. Correspondingly, a certain time passes after the movements carried out by the person, until an adjustment of the vehicle closing element actually is made or until the detection of a valid operating event is signaled to the user by corresponding preceding operations. Therefore, a person often performs the movement in the detection area already for a second time, assuming that the first movement has not been detected. This possibly results in an undesired functional behavior and has a negative effect on the operating comfort and the user satisfaction.

In DE 10 2010 060 364 A1 it is proposed already at least indiscriminately that an authentication process can be effected before, during or after the definition of an operating event, wherein ultimately the adjustment of the vehicle closing element only is effected if both a positive authentication and a positive detection of an operating event are present. DE 10 2010 060 364 A1 does not indicate at what time, on what basis and in particular by means of what signal the authentication process is triggered.

SUMMARY

Against this background it is an object underlying the invention to improve a control method and a control system for the adjustment of a power-operated adjustable vehicle closing element with regard to the operating comfort.

This object is solved by methods having features as described herein and a control system with features as described herein.

In a method according to the invention it is detected as an operating event by means of a sensor device in a contactless way whether a person performs a particular movement with a body part in a detection area, wherein for the detection of the operating event a course of measurement values detected (continuously or discretely) by the sensor device in a detection time interval is evaluated. Furthermore, it is provided that at least one trigger signal is generated and sent, which triggers at least one operation preceding the adjustment of the vehicle closing element, without the execution of which an adjustment of the vehicle closing element does not occur. Such a preceding operation then comprises e.g. an authentication process, the unlocking of a lock for the vehicle closing element or the activation of a drive for the adjustment of the vehicle closing element.

According to a first aspect it is provided that at least one measurement value detected for the presence of an operating event is utilized to trigger the sending of the trigger signal, before the detection time interval has elapsed and before—for example with reference to at least one further measurement value and in view of stored criteria, in particular reference and/or threshold values—the course of the measurement values at all can be evaluated as to whether an operating event is present. The sending of the trigger signal thus is triggered on the basis of at least one measurement value for a measurement quantity that first (subsequently) is used for the evaluation as to whether or not an operating event is present. The decision as to whether the sending of the trigger signal is to be started thus can be effected already for example on the basis of a section of the representative course of measurement values completed only later for the presence of an operating event and hence before it is clear whether or not a (permissible) operating event is present at all. Hence, it initially is accepted in principle that the trigger signal has been sent already at least in part or even the operation to be triggered thereby already is started, although no operating event possibly is detected at the end of the detection time interval. However, when an operating event is detected, the at least one operation triggered by the at least one trigger signal is triggered or can be triggered earlier than in previously used control methods in which the sending of the trigger signal can be started only at the end of the detection time interval. Furthermore, due to the use of a measurement value that anyway is necessary for the evaluation as to whether an operating event is present, a detection of an additional measurement quantity for the start of the sending of the trigger signal can be omitted.

The course to be evaluated of measurement values detected by the sensor device in a detection time interval thus is split for example into several (at least two) sub-functions or sections, wherein already on the basis of a first sub-function or a first section a decision is made on the start of the sending of the trigger signal, although it can be decided only by means of the at least one further, second sub-function or the further, second section whether or not a permissible operating even actually is present.

According to the first aspect an authentication process is triggered by means of the trigger signal to be sent, in which the presence of a valid identification means in the vicinity of the vehicle is checked. A trigger signal for triggering the authentication process thus is sent already at a time within the detection time interval at which with reference to the stored criteria no decision can yet be made by means of an evaluation logic as to whether or not a movement to be assessed as an operating event actually is carried out by a person with a body part in a detection area.

In one design variant, the sending of the trigger signal for the start of the authentication process also is completed at a time before the detection time interval has elapsed. Thus, the authentication process here is started not only on the basis of the at least one detected measurement value, before it has been evaluated whether or not an operating event is present. Rather, the authentication process triggered by the trigger signal also can be completed already at a time before the detection time interval has elapsed and before a sufficient number of measurement values has been detected in order to evaluate whether or not an operating event is present. The duration and hence signal length of a trigger signal and the duration and hence length of the authentication process here consequently are adjusted to each other and to the detection time interval such that the completion of the authentication process once admissibly started in any case still is completed within the detection time interval. At the end of the detection time interval for the examination as to whether an operating event is present it hence has been checked already whether an identification means is present in the vicinity of the vehicle. When a permissible operating event actually has been detected, the adjustment of the vehicle closing element thus can be triggered right at the end of the detection time interval, as the authentication process and hence the search for a valid identification means and hence for an authenticated user already has been carried out in parallel. When no valid identification means within reach has been determined, the adjustment of the vehicle closing element does not occur and the control method can be stopped directly after the evaluation as to whether or not an operating event is present.

In an alternative design variant it is provided that the sending of the trigger signal, when an operating event has been detected, is completed only at a time after the detection time interval has elapsed. The sending of the trigger signal triggering the authentication process thus is started within the detection time interval on the basis of the at least one detected measurement value. However, the sending and hence the transmission of the trigger signal is not completed yet by the end of the detection time interval. At the end of the detection time interval the trigger signal hence still is incomplete and the authentication is not yet started.

In one design variant, it is stored in an electronic control unit receiving the trigger signal for the start of the authentication process that the authentication process only is started when a trigger signal with a specified signal length, for example in the form of a coded signal with high and low levels, in the form of a pulse or in the form of a pulse sequence with predefined signal, pulse or sequence length, is received. In the proposed design variant, the sending of the trigger signal now is started yet in the detection time interval, but at a time at which the temporal distance to the end of the detection time interval is so small that the trigger signal cannot have been sent yet completely by the end of the detection time interval. By the end of the detection time interval merely a part of the trigger signal necessary for triggering the authentication process has been transmitted in this variant, so that in the absence of a detection of a (permissible) operating event the sending of the trigger signal can be stopped after the detection time interval and hence the trigger signal sent so far remains incomplete. The authentication preceding the adjustment of the vehicle closing element thus is not carried out (and hence neither the adjustment of the vehicle closing element, which cumulatively requires a positive authentication and the detection of an operating event). When an operating event is detected, the trigger signal only must be sent further and hence be prolonged to the defined signal length in order to trigger the authentication process. As the sending of the subsequently completed trigger signal is started already before the detection of an operating event,—as compared to a sending of the trigger signal started only after the detection of an operating event—the time which passes from the beginning of the movement carried out by the user until the completion of the authentication and the adjustment of the vehicle closing element can be reduced.

Independent of whether the sending of the trigger signal is completed only after the end of the detection time interval (in the case of a positive detection of an operating event) or within the detection time interval, the time at which the sending of the trigger signal is triggered for example can lie at the beginning of the detection time interval or at a time within the detection time interval, at which a criterion concerning the number of detected measurement values, which is stored in an electronic control device, is fulfilled. Such a criterion for example can comprise the exceedance of a minimum number of measurement values that must be available in order to be able to assume an operating event with a defined probability. The beginning of the time at which the sending of the trigger signal is triggered thus can lie at a time within the detection period at which a sufficient (previously defined) amount of measurement values is available, which allows an operating event to be assumed with a sufficient (previously defined) probability. For example, this time lies in a last half of the detection time interval. In a second half of the detection time interval it can be assumed, for example, that a meaningful tendency for the presence of an operating event already is possible on the basis of the number of detected measurement values and hence an assessment with a sufficient probability (which possibly has previously been stored in an electronic control device). In the last-mentioned case, the sending of the trigger signal for example always is effected only after more than half of the detection time interval has elapsed, and in particular in a last third of the detection time interval.

The early sending of at least a part of a trigger signal that is completed after the detection of an operating event, in particular is prolonged to a predefined signal length, quite obviously is independent of the question on what basis and in particular what measurement quantity and hence what measurement value the sending of the trigger signal is triggered. Correspondingly, according to a further aspect—to be combined in principle with the first aspect—there is proposed a method for controlling an adjusting movement of a power-operated adjustable vehicle closing element, in which at least one trigger signal with a defined signal length is generated and sent, which triggers at least one operation preceding the adjustment of the vehicle closing element. This at least one operation in particular can comprise the above-explained authentication process, the actuation of a lock for unlocking the vehicle closing element and/or the activation of a drive for the power-operated adjustment of the vehicle closing element. According to the second aspect it is provided that the sending of the trigger signal is started at a time in the detection time interval, so that at the end of the detection time interval the trigger signal has not yet reached the defined signal length, and only upon detection of an operating event the trigger signal is sent further until reaching the defined signal length and hence completed, but otherwise the sending of the same is stopped.

According to one design variant the sending of the trigger signal can be stopped when no operating event has been detected, so that the trigger signal transmitted so far remains incomplete and the operation preceding the adjustment of the vehicle closing element is not triggered. Hence, for example, no authentication process is started and/or no activation of a drive for the adjustment of the vehicle closing element is effected, just like of course the adjustment of the vehicle closing element itself is not effected.

According to the second aspect a trigger signal, in particular in the form of a pulse, a pulse sequence or a continuous signal sequence (the latter in particular as a coded signal with high and low levels) thus is prolonged to the full length when an operating event has been detected. The complete trigger signal can be sent already distinctly earlier than in a case when sending is effected only upon completion of the detection of an operating event. When no operating event is detected, the operation preceding the adjustment of the vehicle closing element is not carried out either on the basis of the incomplete trigger signal. The only partial sending of the (hence incomplete) trigger signal preferably remains without any consequence and in particular is not noticeable for a user.

In one exemplary embodiment more than half of the trigger signal for triggering the operation preceding the adjustment of the vehicle closing element has been sent already before the end of the detection time interval. Accordingly, in this variant more than half of the trigger signal, in particular more than 70% of the trigger signal has already been transmitted before an operating event is detectable. For example, more than half of the trigger signal to be transmitted for starting the authorization process has already been transmitted to an electronic authentication system and/or more than half of the trigger signal to be transmitted for the activation of the lock and/or the drive has already been transmitted to an electronic control system of the lock or drive, before it is detected whether or not an operating event actually is present.

The beginning of the sending of the trigger signal in principle can be triggered by a detected measurement value exceeding or falling short of a specified threshold value, before the detection interval has elapsed and it has been evaluated whether or not an operating event is present.

In principle, for the adjustment of the vehicle closing element a drive can be activatable by means of a (further) trigger signal in the form of a control signal, wherein the sending of this control signal is started after the detection time interval has elapsed and it is evaluated whether an operating event is present. In a first design variant based thereon, merely an authentication process is started for example by means of a trigger signal sent partly or completely before the end of the detection time interval. When at the end of the authentication process a positive authentication is present for the presence of a valid identification means in the vicinity of the vehicle, the subsequent actuation of a lock and/or the subsequent activation of the drive for the adjustment of the vehicle closing element thereby is automatically triggered by means of a control signal. In a second design variant the authentication process for example is triggered by an electronic control device by means of a first trigger signal and separately the activation of a drive by the same electronic control device by means of a further, second trigger signal in the form of the control signal.

To avoid a faulty sending of the trigger signal, it can be provided in principle that the generation and the beginning of the sending of the trigger signal are dependent on at least one additional criterion. Such an additional criterion for example can be a temporal development of successive detected measurement values and/or the value of a maximum of detected measurement values. For example, the sending of the trigger signal in principle can be dependent on whether a measurement quantity evaluated for the presence of an operating event exceeds a (first) threshold value with detected measurement values. For the beginning of the sending of the trigger signal, however, it then is evaluated in addition in how far successive measurement values rise or fall (before or after the exceedance of the threshold value) and/or whether the course of the measurement values has a (local) maximum whose value does not exceed or fall below a reference value. The temporal development of successively detected measurement values chosen as an additional criterion for the sending of the trigger signal and/or the value of a maximum of detected measurement values in comparison with a stored reference or a plurality of stored references should allow a statement to be made as to whether the presence of an operating event actually seems to be probable. When the at least one additionally evaluated criterion speaks against the presence of an operating event, the sending of a trigger signal also is obsolete that an operation preceding the adjustment of the vehicle closing element, in particular an authentication process starts, which without the presence of an operating event anyway does not lead to the adjustment of the vehicle closing element.

As already explained above, a kick movement carried out by a person, in particular in the region of the bumper of the vehicle, is detected as an operating event by means of the sensor device, for example in a contactless way. Such an operating event then will preferably trigger the adjustment of a vehicle closing element in the form of a liftgate or a trunk lid of the vehicle.

Another aspect of the invention furthermore is the provision of a control system for an adjusting device for the power-operated adjustment of a vehicle closing element. Such a control system comprises at least one sensor device by means of which it is detectable as an operating event in a contactless way that a person has carried out a particular movement in a detection area with a body part. Furthermore, the control system comprises an electronic control device by means of which     a course of measurement values detected (continuously or discretely) by the sensor device in a detection time interval can be evaluated as to whether an operating event is present, at least one trigger signal of defined signal length can be generated and sent, which triggers at least one operation preceding the adjustment of the vehicle closing element.

According to the invention it now furthermore is provided that the electronic control device is configured a) to use at least one measurement value detected for the presence of an operating event to trigger the sending of a trigger signal for an authentication process in which the presence of a valid identification means in a vicinity of the vehicle is checked, before the detection time interval has elapsed and before the course of the measurement values can be evaluated as to whether (or not) an operating event is present, and/or b) to begin the sending of the trigger signal at a time in the detection time interval, so that at the end of the detection time interval the trigger signal has not yet reached the defined signal length, and only upon detection of an operating event the trigger signal is sent further until reaching the defined signal length, but otherwise the sending of the same is stopped.

The proposed control system in particular can be useful for carrying out a method according to the invention. Correspondingly, the features of an exemplary embodiment for a method according to the invention (according to the first or second aspect) as explained above and below also are applicable for exemplary embodiments of a control system according to the invention, and vice versa.

BRIEF DESCRIPTION OF THE DRAWINGS

The attached Figures by way of example illustrate possible design variants of the proposed solution.

DETAILED DESCRIPTION

Figure 4:
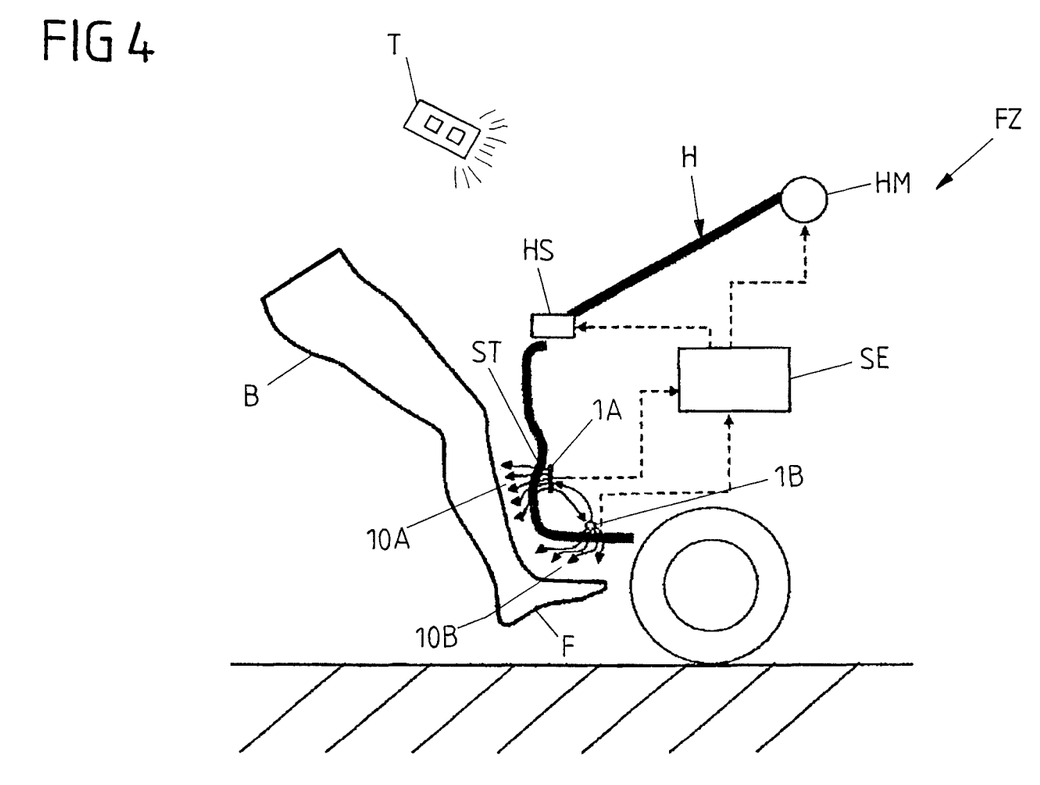
FIG. 4 schematically shows the rear end of a vehicle with a liftgate as a vehicle closing element by illustrating a control system according to the invention.

FIG. 4 shows a design variant of a control system according to the invention that is used in a vehicle FZ. The vehicle FZ includes a vehicle closing element in the form of a liftgate H. The liftgate H is adjustable in a power-operated way by means of a liftgate drive HM. For this purpose, the liftgate drive HM includes for example at least one electric motor. In a closed condition of the liftgate H the same is locked via a liftgate lock HS and hence blocked against an unauthorized opening.

To open the liftgate H it will be sufficient that an authorized or authenticated user carries out a kick movement in the region of a rear-end bumper ST of the vehicle FZ. The kick movement carried out with a leg B and a foot F of the user in the region of the bumper ST correspondingly should be detectable as an operating event in a contactless way. To this end there is provided a sensor device comprising several, here at least two, capacitive sensor elements 1A and 1B of the control system. The sensor elements 1A and 1B are spatially separate from each other and monitor different, possibly overlapping detection areas 10A and 10B before and below the bumper ST, which jointly define a detection area of the control system, in response to an approach of the user and the execution of the kick movement.

By means of the sensor elements 1A and 1B for example a change in capacitance in the respective detection areas 10A and 10B associated to a sensor element 1A or 1B is detected. Via the detected measurement values for the changing capacitance a kick movement can then be inferred. The measurement values detected by means of the sensor device 1A, 1B are evaluated by an electronic control device SE connected to the sensor elements 1A and 1B, which to this end integrates an evaluation logic. When a course of measurement values detected in a detection time interval reveals that an operating event is present, the liftgate lock HS is actuated by means of the electronic control device SE for unlocking the liftgate H and the liftgate drive HM is actuated for adjusting the liftgate H.

Before adjusting the liftgate H, here before opening the liftgate H, it first is checked whether in the vicinity of the vehicle F, i.e. in a defined radius around the vehicle FZ, a valid identification means is present, for example in the form of a transponder T of a remote control unit for the vehicle FZ. It hence is checked for example whether a valid vehicle key is present in the vicinity of the vehicle FZ. It then is concluded therefrom that the kick movement was carried out by an authorized/authenticated user. By the corresponding authentication process it is correspondingly avoided that every kick movement (of an arbitrary person) carried out in the region of the bumper ST already leads to an opening of the liftgate H.

Figure 5:
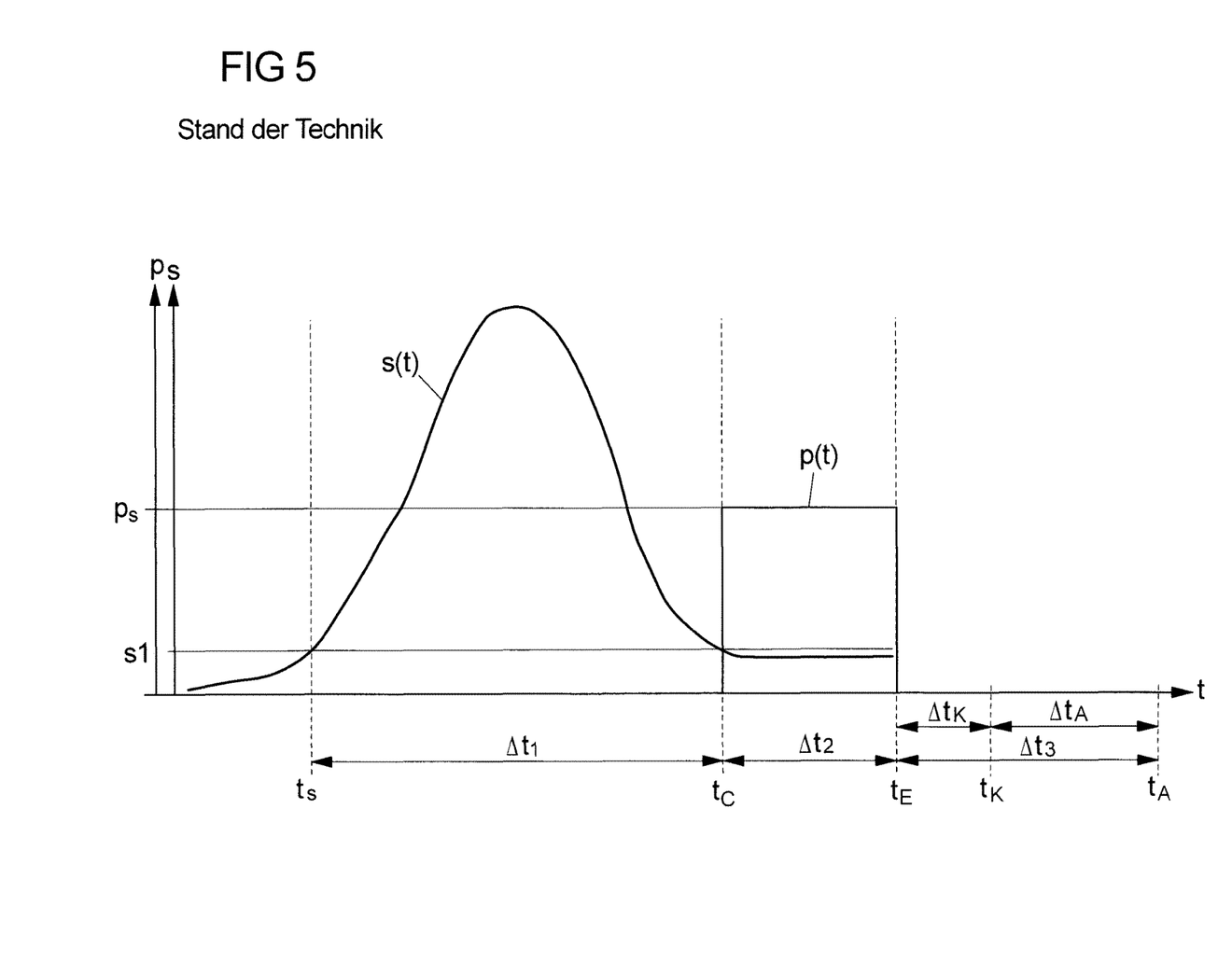
FIG. 5 shows a signal-time diagram for a sequence of a control method known from the prior art.

The signal-time diagram of FIG. 5 illustrates a method known from the prior art for controlling the adjusting movement of the liftgate H on opening in response to a detected, permissible operating event.

In the diagram of FIG. 5 a course of measurement values detected by the sensor device 1A, 1B on the one hand is plotted as measurement signal s over the time t. The parabolic course of the measurement signal s as shown in FIG. 5 is representative for a kick movement carried out at the bumper ST and hence for a positive detection of an operating event. Moreover, an additional ordinate for the temporal development of a trigger signal p over the time t is provided in the diagram of FIG. 5. In the illustrated diagram (like also in the diagrams explained below), a pulse or signal strength $p_s$ of a sent trigger signal p merely is indicated by way of example. Alternatively, a coded signal with different high and low levels, a pulse sequence, or a pulse sequence with at least two different pulse strengths can of course also be sent. Sending start and duration of transmission of the trigger signal p each are controlled by the electronic control device SE.

In the case of a kick movement to be detected, the measurement signal s initially rises above a stored threshold value s1. At a time $t_s$, at which the threshold value s1 is exceeded, for example both sensor elements 1A and 1B are activated. From this time $t_s$ the electronic control device SE therefore takes account of the measurement values for the evaluation as to whether a permissible operating event actually is present. When in a succeeding detection time interval $\Delta t_1$ up to a time $t_C$ the illustrated parabolic course of the measurement signals s is detected, i.e. in particular the rise up to a plateau or maximum value of the measurement signal s and a subsequent decrease below the threshold value s1, an evaluation logic of the electronic control device 1A, 1B assesses this as a valid operating event and sends a trigger signal p in the form of a pulse with a length of 400 ms. In the present case, this trigger signal p represents a trip signal for triggering the authentication process in order to check whether a valid transponder T is present in the vicinity of the vehicle FZ. The related key search thus is started after a time interval $\Delta t_2$=400 ms after the time $t_C$ of the detection of a permissible operating event, namely after the complete receipt of the pulse with a length of 400 ms at a time $t_E$. This key search and the related authentication process takes a time $\Delta t_K$. When the authentication process is completed and a valid transponder T is detected at a time $t_K$, a further operation likewise preceding the actual adjustment of the liftgate H is triggered, namely the actuation of the liftgate drive H and possibly before this the actuation of the indicators and/or headlights of the vehicle FZ in order to visually inform a user of the successful detection of an operating event (before the liftgate H is adjusted). Up to the adjustment of the liftgate H via the liftgate drive HM a further time interval $\Delta t_A$ again passes, until the liftgate drive H actually triggers the adjustment of the liftgate H.

In the scenario with successive signaling after completion of the detection of a permissible operating event as shown in FIG. 5 comparatively much time elapses until a feedback actually is provided to the user that the operating event has been detected successfully, and until a visible adjustment of the liftgate H actually is effected. This leads to the fact that a user possibly assumes that the kick movement carried out by him has not successfully been detected by means of the sensor device 1A, 1B. The user thus carries out the kick movement once again or already tries to otherwise open the liftgate H. Thus, maloperations and/or malfunctions can occur.

To increase the customer benefit and the customer satisfaction it is regarded as advantageous against this background to shorten the time between the successful detection of a permissible operating event and the actual adjustment of the liftgate H (or another vehicle closing element). In accordance with the proposed solution this is achieved in that the sending of at least one trigger signal for triggering an operation necessarily preceding the adjustment of the vehicle closing element, here of the liftgate H, at least partly takes place already before the evaluation as to whether or not a permissible operating event is present. Furthermore, to avoid additional sensor elements, the sending of such a trigger signal for the start of an authentication process in this connection can depend on at least one measurement value and hence on the measurement signal s, which anyway is detected and evaluated in order to detect an operating event.

In one design variant, which is illustrated with reference to the diagram of FIG. 1, e.g. a trigger signal in the form of a trip signal p with a pre-defined signal length $\Delta t_1$ is sent in order to start the start of an authentication process at a time $t_E$, which represents the signaling end and hence the end of the 400 ms pulse. In contrast to the method known from the prior art, however, the sending of the trip signal p for triggering the authentication process already has started before the detection time interval $\Delta t_1$ is completed, and hence it is possible at all for the electronic control device SE to finally evaluate whether or not a permissible operating event actually is present. The beginning of the sending of the trip signal p rather is started already at a time $t_P$ at which it appears sufficiently probable in principle that a kick movement actually is just carried out in the region of the bumper ST and at the end of the detection time interval $\Delta t_1$ a permissible operating event will be detected.

The/a criterion for the beginning of the sending of the trip signal p at the time $t_P$ within the detection time interval $\Delta t_1$ is stepping through a maximum by the detected measurement signal s. Stepping through this maximum for example is detected with reference to a second threshold value s2 (with s2>s1), wherein this second threshold value s2 likewise is stored in the evaluation logic of the electronic control device SE. The kick movement to be detected thus is split into at least two sub-functions, on the one hand into a pre-kick and a subsequent confirmation. The detection of a pre-kick or rather a pre-kick event on the basis of the previous measurement signal s in merely one section of the detection time interval $\Delta t_1$ thus already triggers the sending of the trip signal p, although the presence of a permissible operating event only can be detected at the later time $t_C$ at the end of the detection time interval $\Delta t_1$.

The possible beginning of the sending of the trip signal p and hence for example the height of the second threshold value s2 and the duration of the trip signal p are adjusted to each other and to the detection time interval $\Delta t_1$ such that when the sending of the trip signal p once has been triggered, this trip signal p has not yet been sent completely by the end of the detection time interval $\Delta t_1$ and hence by the time of the evaluation and detection of a permissible operating event. Thus, the trip signal p has not yet been sent over the specified, full signal length, here 400 ms, which is necessary to trigger the authentication process.

For example, the beginning of the sending of the trip signal p and hence the start of a pre-kick signaling at the time $t_P$ at the earliest is effected at a time within the detection time interval $\Delta t_1$, at which a criterion concerning the number of detected measurement values, which is stored in the electronic control device SE, is fulfilled. Such a criterion for example can comprise the exceedance of a minimum number of measurement values that must be available in order to be able to assume an operating event with a sufficient probability. For example, the beginning of the sending of the trip signal p is effected after more than half of the detection time interval $\Delta t_1$ has elapsed. The beginning of the sending of the trip signal p after the elapse of a time interval $\Delta t_P$ (with $\Delta t_P > \frac{1}{2}\Delta t_1$) after the beginning of the detection time interval (at a time $t_S$) thus always is so large that by the end of the detection time interval $\Delta t_1$ a complete trip signal, which hence is suited to trigger the authentication process, never is present. Hence, the sending of the trip signal p at the end of the detection time interval $\Delta t_1$ can yet be stopped, in case no permissible operating event is detected. The incompletely sent trip signal p remains without effect and does not trigger the start of the authentication process. When a valid operating event on the other hand is detected, the sending of the trip signal p is prolonged, so that the trip signal p is sent further until reaching the defined signal length (here $t_E$-$t_P$) and hence the authentication process is started.

Due to the partial transmission of the trip signal p for triggering the authentication process, which is preceding already and is parallel to the detection of an operating event, a distinct shortening of the time interval that elapses between the beginning of the execution of the kick movement by a user and the actual adjustment of the liftgate H is achieved. For example, assuming a magnitude of this time interval of 1550 ms in the prior art represented with the diagram of FIG. 5, this time interval can be shortened to 1250 ms in the design variant corresponding to the diagram of FIG. 1. The actuation of an electronic authentication logic and of an electronic control unit of the liftgate drive HM for example is effected via a CAN or LIN bus.

Figure 2:
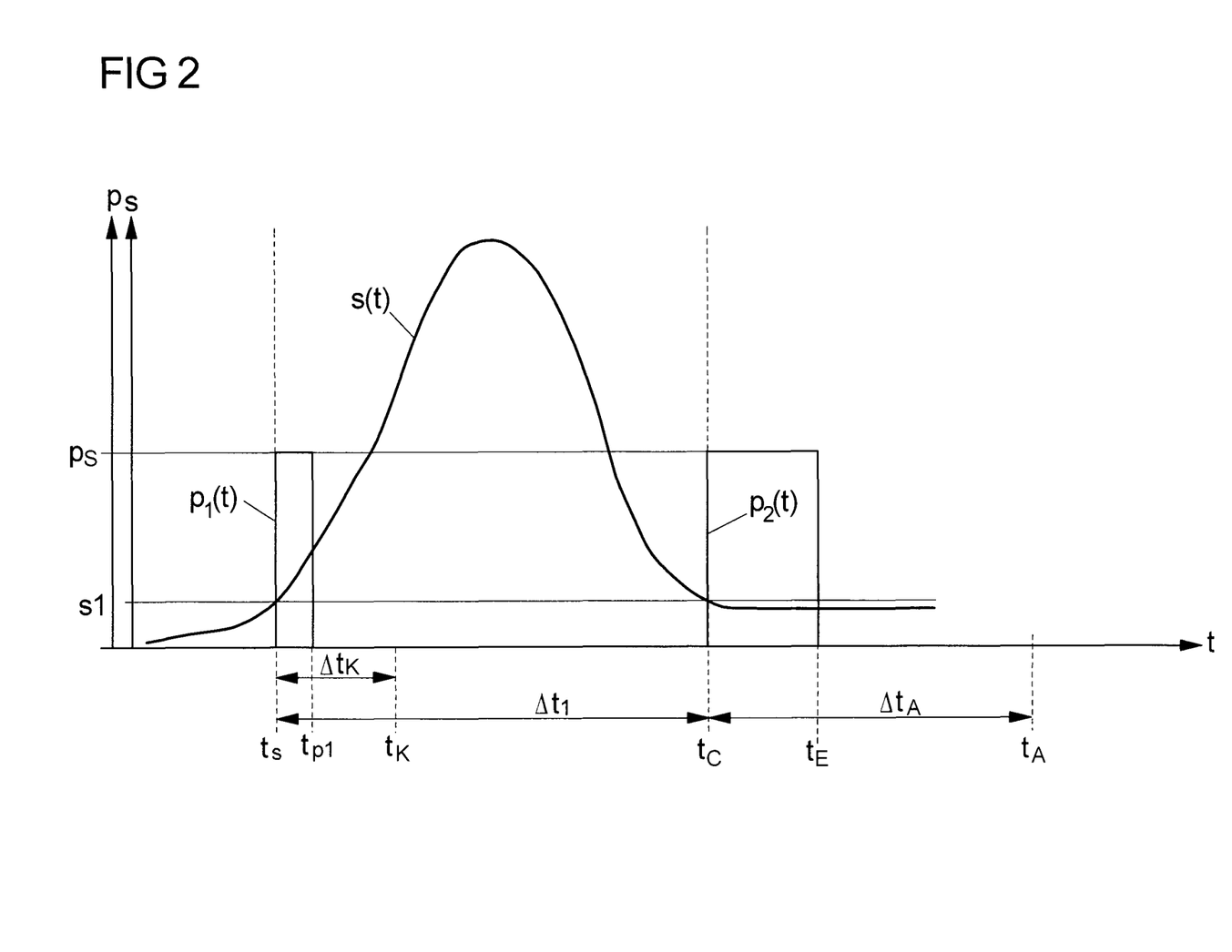
FIG. 2 shows a signal-time diagram for a second exemplary embodiment in which an authentication process and an activation of a drive for adjusting a vehicle closing element (possibly with preceding actuation of a lock) are triggered via separate trigger signals, and a trigger signal for triggering the authentication process already is sent at an early stage before completion of the detection of an operating event.

In the design variant shown with the diagram of FIG. 2 two different trigger signals $p_1$ and $p_2$ in the form of a trip signal $p_1$ and a control signal $p_2$ are provided, which are sent at different times in order to on the one hand trigger the authentication process and hence the key search and on the other hand the activation of the liftgate drive HM (including the actuation of the liftgate lock HS to release the liftgate H).

In the illustrated design variant, the sending of the trip signal $p_1$ already is triggered at the beginning of the detection time interval $\Delta t_1$ and hence by the measurement signal s exceeding the threshold value s1. The transmission of this trip signal $p_1$ for example is effected via a LIN bus. When the trip signal $p_1$ is sent completely at a time $t_{P1}$, the authentication process and in particular the key search herewith is triggered, even while the measurement signal s is detected further in order to be able to assess at the later time $t_C$ whether or not a permissible operating event actually is present. The key search usually taking less than 200 ms, e.g. 150 ms, then is completed at a time $t_K$ within the detection time interval $\Delta t_1$. In this variant, the length of the trip signal $p_1$ to be transmitted for triggering the authentication process and the duration of the key search thus are adjusted to each other and to the detection time interval $\Delta t_1$, so that a time interval $\Delta t_K$, which has elapsed between the beginning of the sending of the trip signal $p_1$ and the end of the key search, completely lies within the detection time interval $\Delta t_1$.

The key search thus in any case is completed already after the detection of a pre-kick event, before it is evaluated whether or not a permissible operating event actually is present. At the end of the detection time interval $\Delta t_1$ and with a positive detection of an operating event, the activation of the liftgate drive HM and possibly an indicator actuation must yet be triggered via the sending of the control signal $p_2$. When both trigger signals $p_1$ and $p_2$ are transmitted via a LIN bus for triggering the authentication process and for activating the liftgate drive HM (and the liftgate lock HS), the time here can also easily be shortened to 1100 ms, which period elapses between the beginning of a kick movement and the actual adjustment of the liftgate H.

Figure 1:
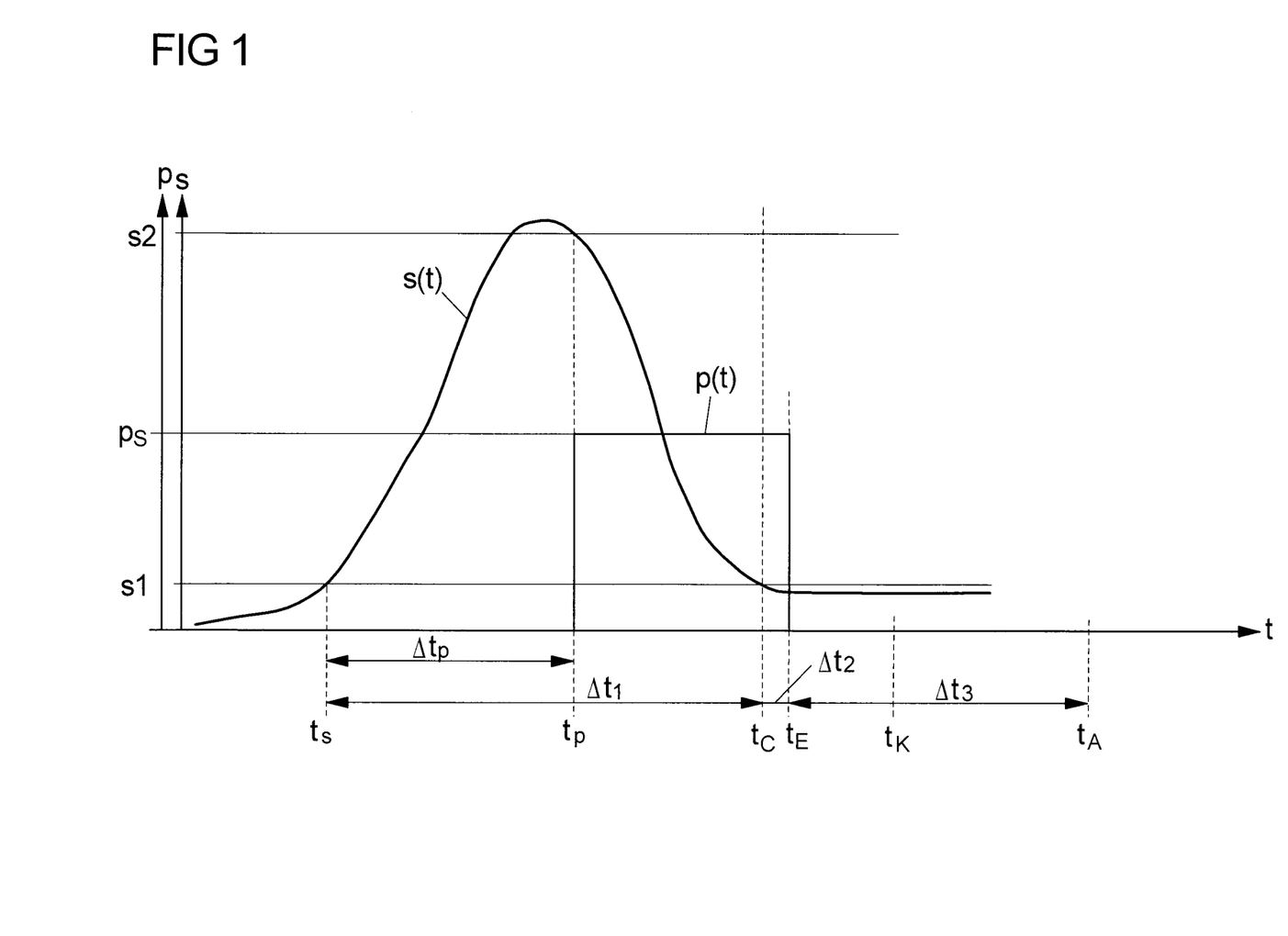
FIG. 1 shows a signal-time diagram for a first exemplary embodiment of an inventive method of a correspondingly operating exemplary embodiment for a control system according to the invention, in which the sending of a trigger signal for starting an authentication process already is started when with reference to a measured course of a measurement signal it cannot finally be evaluated whether a permissible operating event actually is present, and only upon positive detection of an operating event the trigger signal is completed in order to actually trigger the authentication process.
Figure 3:
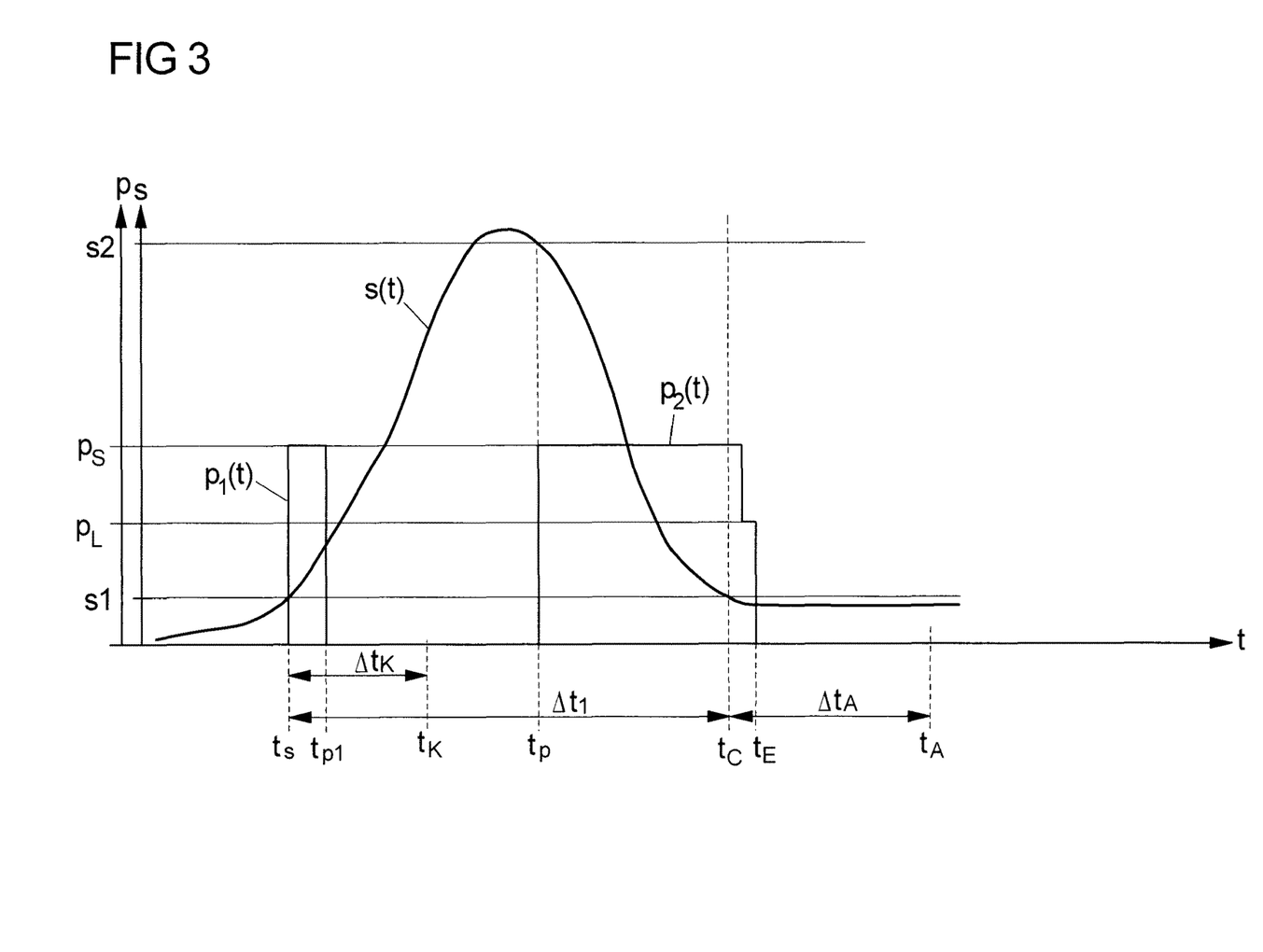
FIG. 3 shows a signal-time diagram for a third exemplary embodiment in which analogous to the second exemplary embodiment according to FIG. 2 different trigger signals are used for the start of an authentication process and the activation of a drive, but in contrast to the second exemplary embodiment the sending of the trigger signal for the activation of the drive is started before the detection of an operating event and is completed only upon positive detection of the operating event.

In the design variant shown with the diagram of FIG. 3, the two aspects of the design variants of FIGS. 1 and 2 are combined with each other. Here as well, the authentication process already is started at an early time upon detection of a pre-kick event by generating and sending a first trigger signal in the form of a trip signal $p_1$, so that the authentication process is completed yet within the detection time interval $\Delta t_1$. Furthermore, a second trigger signal in the form of a control signal $p_2$ for activating the liftgate drive HM (and with locked liftgate H for the previous or simultaneous actuation of the liftgate lock HS) is started yet at a time $t_P$ within the detection time interval $\Delta t_1$. The sending of the control signal $p_2$ for example is triggered again by the measurement signal s falling short of the second threshold value s2, after the measurement signal s had reached a maximum, as it is accompanied by a swiveling back of a foot F of the user.

When at the end of the detection time interval $\Delta t_1$ no operating event is detected by means of the electronic control device SE, the sending of the control signal $p_2$ is stopped, so that the same remains incomplete and—independent of the outcome of the authentication process—no actuation of the liftgate drive HM (and possibly of the liftgate lock HS and of the vehicle indicators) is effected.

On the other hand, when by the end of the detection time interval $\Delta t_1$ a valid operating event is detected with reference to the course of the measurement signal s and the measurement values forming this course, the control signal $p_2$ is sent further up to the signal length $t_E$-$t_P$ triggering the activation of the liftgate drive HM and hence completed. The further sending of the control signal $p_2$ ultimately each also depends on the positive authentication of a valid transponder T at the end of the authentication process (at the time $t_K$). In other words, the sending of the control signal $p_2$ only is continued upon detection of a valid operating event by the end of the detection time interval $\Delta t_1$, but is stopped when beforehand no valid transponder T has been detected in the vicinity of the vehicle FZ.

The diagram of FIG. 3 by way of example shows the control signal $p_2$ for actuating the liftgate drive HM as a high-low sequence. A complete control signal $p_2$ that triggers the activation of the liftgate drive HM thus contains a defined signal or pulse sequence, here for example with a pulse of a first signal or pulse strength $p_S$ followed by a signal or a pulse with a second (here: lower) signal or pulse strength $p_L$. When this sequence is transmitted only incompletely, no activation of the liftgate drive HM is effected. Correspondingly for example the earliest possible time $t_P$ for the beginning of the sending of the control signal $p_2$ within the detection time interval $\Delta t_1$ can be specified such that by the end of the detection time interval $\Delta t_1$ always only a part of the sequence has been transmitted and only upon detection of a permissible operating event the sequence of the control signal $p_2$ is completed, for example with the signal or pulse component of a lower signal or pulse strength $p_L$.

The receivers of the respective trigger signals p, $p_1$ and $p_2$ for example can be electronic control devices and in particular control devices within the vehicle FZ, which for example control the key search or are associated with the liftgate lock HS and the liftgate drive HM and which via a LIN or CAN bus are connected to the electronic control device SE.

The generation and the beginning of the sending of a trigger signal p, $p_1$ or $p_2$ in principle can be dependent on at least one additional criterion, in particular on a measurement value of the sensor elements 1A or 1B and/or on a measurement value of a further (non-illustrated) sensor element. For example, the sending of the trigger signal/trip signal $p_1$ for the start of an authentication process can be avoided when an additional evaluation reveals that the presence of a pre-kick event and hence also at a later time the presence of a permissible operating event is improbable. To this end, for example, a temporal development of successive measurement values for the measurement signal s and/or the value of a maximum of detected measurement values in the detection time interval Δt1 or a subinterval of this detection time interval Δt1 can be employed.

It is of course not absolutely necessary that the at least one additional criterion for the beginning of the sending of a trigger signal p, $p_1$ or $p_2$ also is employed for the final evaluation as to whether or not a valid operating event is present. Thus, with regard to the evaluation as to whether a permissible operating event is present the at least one additional criterion can have an at least partly redundant information content. During the execution of a kick movement this additional criterion can however be utilized already in order to exclude a real kick (against the or in the direction of the bumper ST).

LIST OF REFERENCE NUMERALS 1A, 1B sensor element
10A, 10B detection area
B leg
F foot
FZ vehicle
H liftgate (vehicle closing element)
HM liftgate drive
HS liftgate lock
P, $p_1$, $p_2$ trip/control signal (trigger signal)
$p_s$ pulse/signal strength
s measurement signal
s1, s2 threshold value
SE electronic control device
ST bumper
t time
T transponder (identification means)
$t_A$ activation end
$t_C$ time of the detection of a permissible operating event
$t_E$ signaling end
$t_K$ time of the completion of the key search/of the authentication process
$t_P$ start of the pre-kick signaling
$t_{P1}$ start of the preliminary signaling
$t_S$ beginning of the evaluation for a possible operating event

The invention claimed is:

1. A method for controlling an adjusting movement of a power-operated adjustable vehicle closing element, via which a body opening of a vehicle can be closed and which can automatically be adjusted to clear a body opening in the presence of an operating event, the method comprising:
   detecting an operating event in a contactless manner via a sensor device when a person carries out a particular movement with their body in a detection area;
   evaluating measurement values detected by the sensor device in a detection time interval;
   generating and sending at least one trigger signal which triggers an execution of an authentication process preceding the adjustment of the vehicle closing element, in which the presence of a valid identification in a vicinity of the vehicle is checked, and
   detecting at least one measurement value for the presence of the operating event to trigger the sending of the trigger signal for the authentication process before the detection time interval has elapsed and before the measurement values can be evaluated as to whether the operating event is present,
   wherein, when the operating event has been detected, the sending of the trigger signal is completed after the detection time interval has elapsed.

2. The method according to claim 1, wherein the sending of the trigger signal is triggered when the detection time interval starts or during the detection time interval, at which a criterion stored in the electronic control device concerning a number of detected measurement values is fulfilled.

3. The method according to claim 2, wherein the sending of the trigger signal is stopped when no operating event has been detected so that the trigger signal remains incomplete and the operation preceding the adjustment of the vehicle closing element is not triggered.

4. The method according to claim 1, wherein the exceedance or undershoot of a specified threshold value triggers a beginning of the sending of the trigger signal before the detection time interval has elapsed.

5. The method according to claim 1, further comprising activating a drive via a control signal for adjusting the vehicle closing element wherein the sending of the control signal is started after the detection time interval has elapsed.

6. The method according to claim 1, wherein via the sensor device a kick movement carried out by a person is detectable as an operating event in a contactless way.

7. The method according to claim 1, wherein the generation and the beginning of the sending of the trigger signal is dependent on at least one additional criterion.

8. The method according to claim 7, wherein the at least one additional criterion is a temporal development of successively detected measurement values and/or a value of a maximum of detected measurement values.

9. A method for controlling an adjusting movement of a power-operated adjustable vehicle closing element, via which a body opening of a vehicle can be closed and which can automatically be adjusted to clear a body opening in the presence of an operating event, the method comprising:
   detecting an operating event in a contactless manner via a sensor device when a person carries out a particular movement with their body in a detection area;
   evaluating measurement values detected by the sensor device in a detection time interval;
   generating and sending at least one trigger signal with a defined signal length which triggers at least one operation preceding the adjustment of the vehicle closing element, and
   starting to send the trigger signal during the detection time interval so that at an end of the detection time interval, the trigger signal has not yet reached the defined signal length, and only upon detection of the operating event, the trigger signal is sent further until reaching the defined signal length, but otherwise the sending thereof is stopped.

10. The method according to claim 9, wherein the sending of the trigger signal is stopped when no operating event has been detected, so that the trigger signal remains incomplete and an operation preceding the adjustment of the vehicle closing element is not triggered.

11. The method according to claim 9, wherein the exceedance or undershoot of a specified threshold value triggers a beginning of the sending of the trigger signal before the detection time interval has elapsed.

12. The method according to claim 9, further comprising activating a drive via a control signal for adjusting the vehicle closing element, wherein the sending of the control signal is started after the detection time interval has elapsed.

13. The method according to claim 9, wherein the sensor device can detect a kick movement carried out by a person as an operating event in a contactless way.

14. The method according to claim 9, wherein the generation and the beginning of the sending of the trigger signal is dependent on at least one additional criterion.

15. The method according to claim 9, wherein the at least one additional criterion is a temporal development of successively detected measurement values and/or the value of a maximum of detected measurement values.

16. A control system for an adjusting device for a power-operated adjustment of a vehicle closing element, via which a body opening of a vehicle can be closed and which can automatically be adjusted for clearing the body opening in a presence of an operating event, the control system comprising:
- a sensor device for detecting in a contactless way the operating event that a person carries out as a particular movement with their body in a detection area; and
- an electronic control device via which:
  - a course of measurement values detected by the sensor device in a detection time interval can be evaluated as to whether the operating event is present, and
  - at least one trigger signal of a defined signal length can be generated and sent, which triggers at least one operation preceding the adjustment of the vehicle closing element, wherein the electronic control device is configured to conduct at least one of the following:
a) to utilize at least one measurement value detected for the presence of the operating event to trigger the sending of a trigger signal for an authentication process in which the presence of a valid identification in a vicinity of the vehicle is checked before the detection time interval has elapsed and before the course of the measurement values can be evaluated as to whether the operating event is present, wherein, when the operating event has been detected, the sending of the trigger signal is completed at a time after the detection time interval has elapsed, and
b) to start the sending of the trigger signal at a time in the detection time interval so that at an end of the detection time interval the trigger signal has not yet reached the defined signal length and wherein, only upon detection of the operating event, the trigger signal is sent further until reaching the defined signal length, but otherwise the sending thereof is stopped.

* * * * *